(12) United States Patent
Sridhar et al.

(10) Patent No.: US 6,723,616 B2
(45) Date of Patent: Apr. 20, 2004

(54) PROCESS OF INCREASING SCREEN DIELECTRIC THICKNESS

(75) Inventors: Seetharaman Sridhar, Richardson, TX (US); Youngmin Kim, Allen, TX (US); Zhiqiang Wu, Plano, TX (US); Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/253,870

(22) Filed: Sep. 24, 2002

(65) Prior Publication Data

US 2003/0060019 A1 Mar. 27, 2003

Related U.S. Application Data

(60) Provisional application No. 60/326,068, filed on Sep. 27, 2001.

(51) Int. Cl.$^7$ .................................................. H01L 21/76
(52) U.S. Cl. .................... 438/424; 438/435; 438/444
(58) Field of Search ............................. 438/424, 435, 438/444, 425, 426, 437, 452

(56) References Cited

U.S. PATENT DOCUMENTS

| | | | | |
|---|---|---|---|---|
| 5,677,233 A | * | 10/1997 | Abiko ........................ 438/424 |
| 5,731,241 A | * | 3/1998 | Jang et al. ................... 438/424 |
| 5,733,383 A | * | 3/1998 | Fazan et al. ................ 148/33.3 |
| 6,074,931 A | * | 6/2000 | Chang et al. ................ 438/424 |
| 6,326,282 B1 | * | 12/2001 | Park et al. ................... 438/424 |
| 6,368,941 B1 | * | 4/2002 | Chen et al. .................. 438/424 |
| 6,372,601 B1 | * | 4/2002 | Dickerson et al. .......... 438/424 |
| 6,472,292 B2 | * | 10/2002 | Konishi ...................... 438/427 |

\* cited by examiner

*Primary Examiner*—Matthew Smith
*Assistant Examiner*—Lex H. Malsawma
(74) *Attorney, Agent, or Firm*—Peter K. McLarty; W. James Brady, III; Frederick J. Telecky, Jr.

(57) ABSTRACT

A method of forming a semiconductor device using shallow trench isolation, includes forming a trench within a semiconductor substrate and forming a screen dielectric stack outwardly from the semiconductor substrate. The screen dielectric stack includes a first sacrificial dielectric layer disposed outwardly from the semiconductor substrate and a second sacrificial dielectric layer disposed outwardly from and in contact with the first sacrificial dielectric layer. In one embodiment, the first sacrificial dielectric layer is formed before forming the trench and the second sacrificial dielectric layer is formed after forming the trench.

3 Claims, 2 Drawing Sheets

PROCESS OF INCREASING SCREEN DIELECTRIC THICKNESS

This application claims priority under 35 USC §119(e)(1) of provisional application Serial No. 60/326,068, filed Sep. 27, 2001.

TECHNICAL FIELD OF THE INVENTION

This invention relates generally to the field of semiconductor devices and, more specifically, to a process for increasing screen dielectric thickness without significantly affecting shallow trench isolation corner protection.

BACKGROUND OF THE INVENTION

Screen dielectric layers used in semiconductor devices can protect the substrate of a semiconductor device during formation of active areas. As semiconductor devices continue to be scaled smaller, the thickness of the sacrificial screen dielectric layer used to protect the semiconductor substrate during formation of active areas likewise tends to decrease. Thinning the sacrificial screen dielectric layer often leads to a reduction in gate oxide integrity (GOI) and reliability of the semiconductor device. Consequently, as semiconductor geometry shrinks, screen dielectric layers, formed through the traditional shallow trench isolation process can fall short of providing adequate protection to the semiconductor substrate.

SUMMARY OF THE INVENTION

The present invention recognizes a need for a method of forming a semiconductor device while maintaining a minimum screen dielectric thickness even as scaling decreases the size of the device. In accordance with the present invention, a method of forming a semiconductor device utilizing a minimum screen dielectric thickness is provided that substantially reduces or eliminates at least some of the shortcomings associated with prior approaches.

In one aspect of the invention, a method of forming a semiconductor device using shallow trench isolation comprises forming a trench within a semiconductor substrate and forming a screen dielectric stack outwardly from the semiconductor substrate. The screen dielectric stack comprises a first sacrificial dielectric layer disposed outwardly from the semiconductor substrate and a second sacrificial dielectric layer disposed outwardly from and in contact with the first sacrificial dielectric layer. In one particular embodiment, the first sacrificial dielectric layer is formed before forming the trench and the second sacrificial dielectric layer is formed after forming the trench.

In another aspect of the invention, a method of forming a semiconductor device using shallow trench isolation comprises forming a dielectric stack outwardly from a semiconductor substrate, the dielectric stack comprising a first sacrificial dielectric layer disposed outwardly from the semiconductor substrate and a second sacrificial dielectric layer disposed outwardly from the first sacrificial dielectric layer. The method further comprises removing a portion of the first sacrificial dielectric layer, a portion of the second sacrificial dielectric layer, and a portion of the substrate to form a trench within the semiconductor substrate and the dielectric stack. The method further comprises forming an isolation dielectric region within the trench, removing the second sacrificial dielectric layer, and after removing the second sacrificial dielectric layer, forming a third sacrificial dielectric layer outwardly from the first sacrificial dielectric layer.

In another aspect of the invention, a semiconductor device results from a process comprising forming a dielectric stack outwardly from a semiconductor substrate, where the dielectric stack comprises a first sacrificial dielectric layer disposed outwardly from the semiconductor substrate and a second sacrificial dielectric layer disposed outwardly from the first sacrificial dielectric layer. The process further comprises removing a portion of the first sacrificial dielectric layer, a portion of the second sacrificial dielectric layer, and a portion of the substrate to form a trench within the semiconductor substrate and the dielectric stack. The process also comprises forming an isolation dielectric region within the trench, removing the second sacrificial dielectric layer, and after removing the second sacrificial dielectric layer, forming a third sacrificial dielectric layer outwardly from the first sacrificial dielectric layer.

In at least some embodiments of the invention, a non-sequentially formed screen dielectric stack substantially prevents implant channeling into the semiconductor substrate during the subsequent formation of an active region in the semiconductor substrate even as devices are scaled to very small sizes. In one particular embodiment of the invention, the screen dielectric stack comprises a combined thickness of at least 100 Angstroms.

Depending on the specific features implemented, particular embodiments of the present invention may exhibit some, none, or all of the following technical advantages. Various aspects of the invention can reduce or prevent implant channeling into the semiconductor substrate during the subsequent formation of an active region even where device scaling would otherwise reduce the thickness of a conventional screen dielectric layer. Various embodiments of the present invention increase the screen dielectric layer thickness without significantly affecting the size of the active area in the semiconductor device.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which.

DETAILED DESCRIPTION OF THE INVENTION

FIGS. 1a through 1g are cross-sectional views showing one example of a method of forming a portion of semiconductor device 10. Semiconductor device 10 may be used as a basis for forming any of a variety of semiconductor devices, such as a bipolar junction transistor, an NMOS transistor, a PMOS transistor, a CMOS transistor, a diode, or a capacitor. Particular examples and dimensions specified throughout this document are intended for exemplary purposes only, and are not intended to limit the scope of the invention.

Figure 1A:
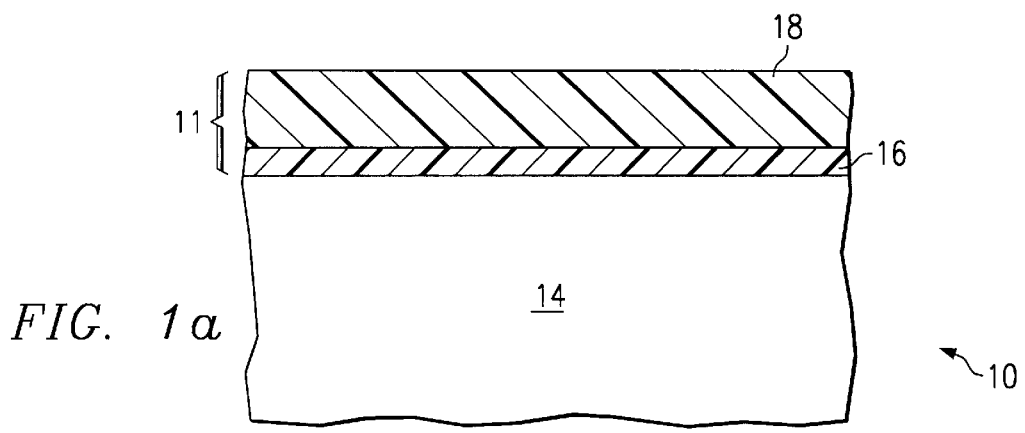
FIGS. 1a through 1g are cross-sectional views showing one example of a method of forming one embodiment of a semiconductor device according to the teachings of the present invention.

FIG. 1a shows a cross-sectional view of semiconductor device 10 a after dielectric stack 11 has been formed outwardly from a semiconductor substrate 14. Semiconductor substrate 14 may comprise any suitable material used in semiconductor chip fabrication, such as silicon or germanium. In this example, dielectric stack 11 comprises a first sacrificial dielectric layer 16 disposed outwardly from semiconductor substrate 14 and a second sacrificial dielectric layer 18 disposed outwardly from first sacrificial dielectric layer 16. Although first sacrificial dielectric layer 16 and second sacrificial dielectric layer 18 are shown as being formed without interstitial layers between them, such interstitial layers could alternatively be formed without departing from the scope of the invention.

In this embodiment, first sacrificial dielectric layer 16 comprises a dielectric material that is selectively etchable from second sacrificial dielectric layer 18. That is, each of first sacrificial dielectric layer 16 and second sacrificial dielectric layer 18 can be removed using an etchant that does not significantly affect the other. First sacrificial dielectric layer 16 may comprise a layer of oxide while second sacrificial dielectric layer 18 may comprise, for example, nitride. Other examples of dielectric materials for first sacrificial dielectric layer 16 may comprise oxi-nitride or silicon oxide.

Forming first sacrificial dielectric layer 16 may be affected through any of a variety of processes. For example, first sacrificial dielectric layer 16 can be formed by growing an oxide. Using a grown oxide as first sacrificial dielectric layer 16 is advantageous in providing a mechanism for removing surface irregularities in semiconductor substrate 14. As oxide is grown on the surface of semiconductor substrate 14, a portion of semiconductor substrate 14 is consumed, including at least some of the surface irregularities.

Forming second sacrificial dielectric layer 18 may be affected through any of a variety of processes. For example, second sacrificial dielectric layer 18 can be formed by depositing nitride.

Figure 1B:
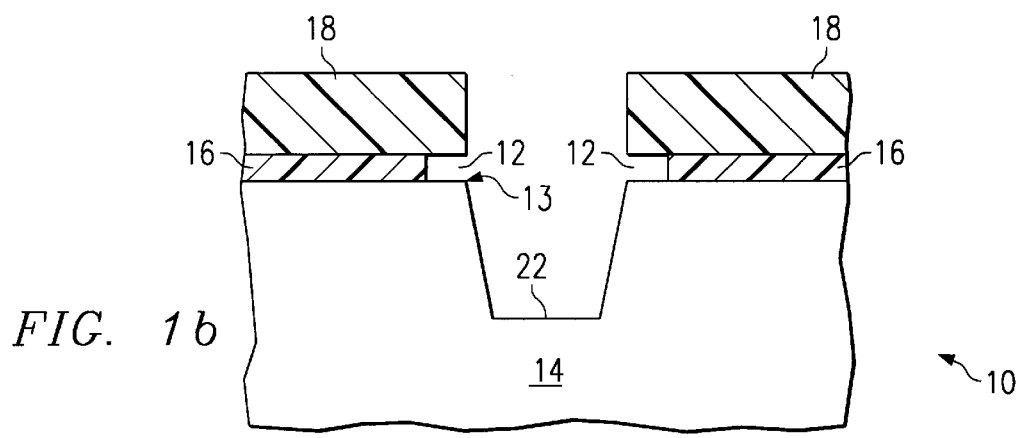

FIG. 1b shows a cross-sectional view of semiconductor device 10 after formation of a trench isolation region 22 within semiconductor substrate 14. Forming trench isolation region 22 may be affected through any of a variety of processes. For example, trench isolation region 22 may be formed by removing a portion of first sacrificial dielectric layer 16, removing a portion of second sacrificial dielectric layer 18, and removing a portion of semiconductor substrate 14. In this particular embodiment, trench isolation region 22 may be formed, for example, by patterning and etching first sacrificial dielectric layer 16, second sacrificial dielectric layer 18, and semiconductor substrate 14 using photoresist mask and etch techniques.

During the pattern and etch or etches used to form trench isolation region 22, a sidewall region 12 of first sacrificial dielectric layer 16 may be removed so that a recessed area results from the removal of sidewall region 12. Sidewall region 12 undercuts an adjacent region of second sacrificial dielectric layer 18. As a result, second sacrificial dielectric layer 18 overhangs sidewall region 12 of first sacrificial dielectric layer 16. Removal of sidewall region 12 may be affected through any appropriate process. For example, sidewall region 12 may be formed using an isotropic etch directed at these regions to laterally etch recesses in first sacrificial dielectric layer 16.

Figure 1C:
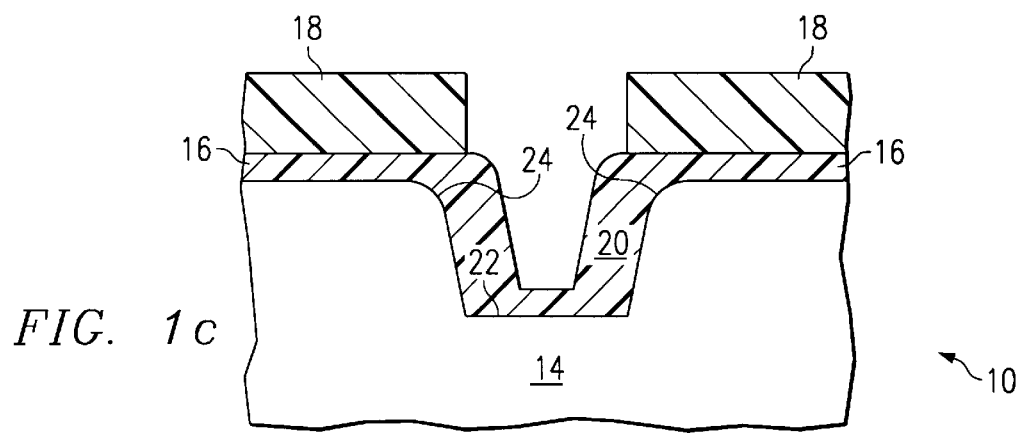

Forming sidewall region 12 in first sacrificial dielectric layer 16 to undercut second sacrificial dielectric layer 18 provides an advantage of permitting the formation of a corner radius 24 within trench isolation region 22 (FIG. 1c illustrates one method of forming corner radius 24). The formation of trench isolation region 22 within semiconductor substrate 14 typically results in the formation of a relatively sharp corner 13 within trench isolation region 22, which can induce a high electric field within semiconductor device 10. The creation of a high electric field at corner 13 can reduce the reliability and gate oxide integrity of semiconductor device 10. Creating corner radius 24 within trench isolation region 22 provides an advantage of reducing the induction of the high electric field at corner 13 and improving the reliability and gate oxide integrity of semiconductor device 10.

FIG. 1c shows a cross-sectional view of semiconductor device 10 after formation of a first trench dielectric layer 20 and formation of corner radius 24 within trench isolation region 22. Forming first trench dielectric layer 20 and corner radius 24 may be affected through any of a variety of processes. For example, first trench dielectric layer 20 and corner radius 24 may be formed simultaneously, by growing a good quality oxide outwardly from trench isolation region 22.

Using a grown oxide as the first trench dielectric layer 20 is advantageous in providing a mechanism for forming corner radius 24 within trench isolation region 22. As oxide is grown in trench isolation region 22, a portion of semiconductor substrate 14 is consumed, including a portion of corner 13. Consuming corner 13 during growth of first trench dielectric layer 20 simultaneously forms corner radius 24. Corner radius 24 is advantageous in reducing the high electric field that may result if the corner radius 24 were not formed.

Figure 1D:
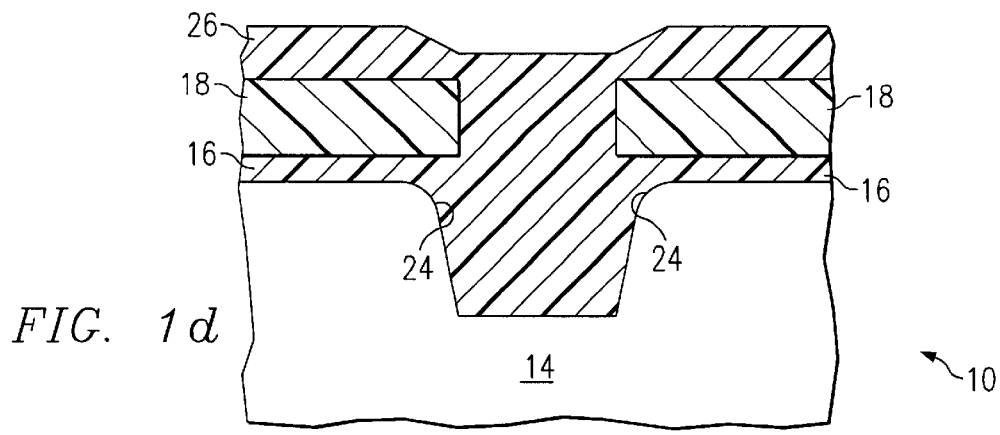

FIG. 1d shows a cross-sectional view of semiconductor device 10 after formation of a second trench dielectric layer 26. Forming second trench dielectric layer 26 may be affected, for example, by depositing a dielectric material, such as oxide or oxi-nitride.

Figure 1E:
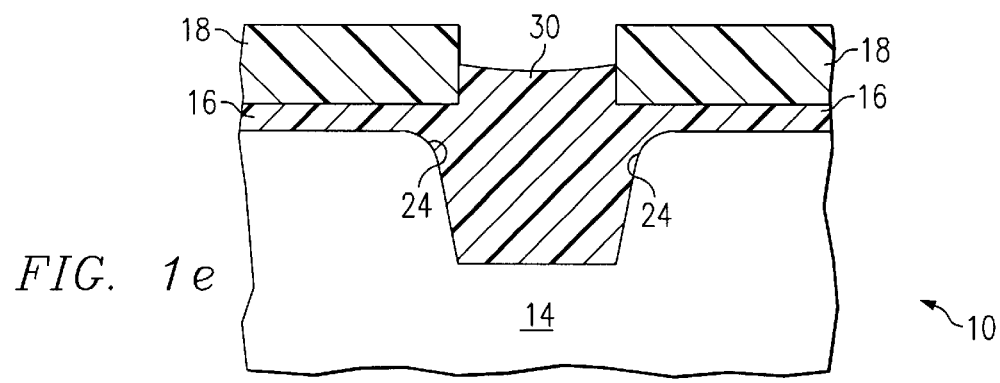

FIG. 1e shows a cross-sectional view of semiconductor device 10 after formation of an isolation dielectric region 30. Isolation dielectric region 30 can be formed by reducing the thickness of the second trench dielectric layer 26. For example, isolation dielectric region 30 may be formed by using a chemical mechanical polish process to reduce the thickness of second trench isolation layer 26. Second sacrificial dielectric layer 18 may be used as a stopping layer in the chemical mechanical polish process.

Figure 1F:
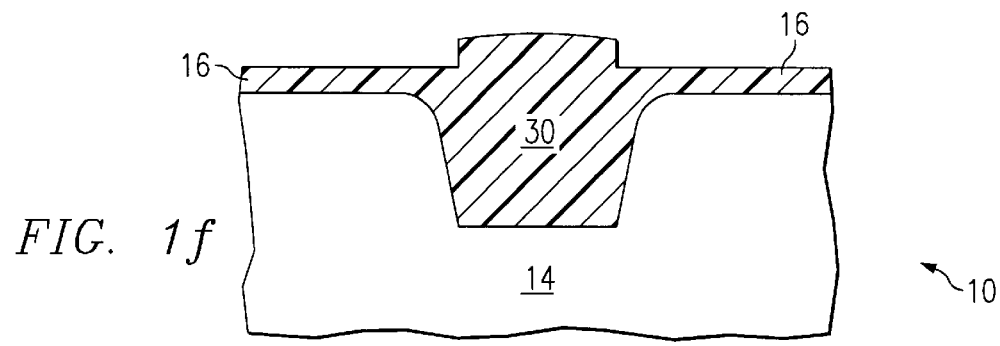

FIG. 1f shows a cross-sectional view of semiconductor device 10 after removal of second sacrificial dielectric layer 18. Second sacrificial dielectric layer 18 may be removed, for example, by dielectrically etching a remaining portion of second sacrificial dielectric layer 18. In one particular embodiment, second sacrificial dielectric layer 18 may be removed by performing a nitride strip where second sacrificial dielectric layer 18 comprises nitride. The etching of the remaining portions of second sacrificial dielectric layer 18 can remove a small amount of material from isolation dielectric region 30.

Figure 1G:
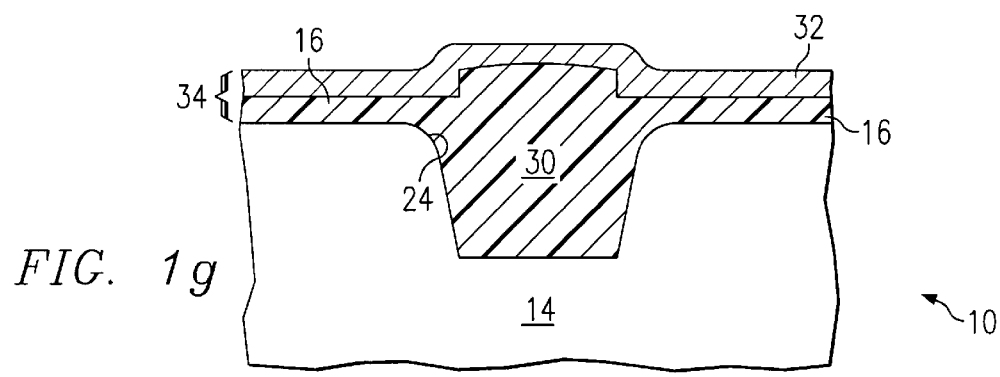

FIG. 1g shows a cross-sectional view of semiconductor device 10 comprising a screen dielectric stack 34 disposed outwardly from semiconductor substrate 14. In this example, second sacrificial dielectric layer 18 has been removed exposing first sacrificial dielectric layer 16. A third sacrificial dielectric layer 32 is then formed outwardly from and in contact with first sacrificial dielectric layer 16. In the illustrated embodiment, screen dielectric stack 34 is formed after removing second sacrificial dielectric layer 18 and prior to formation of an active area in semiconductor substrate 14, without removing the first sacrificial dielectric layer 16. The combination of first sacrificial dielectric layer 16 and third sacrificial dielectric layer 32 forms screen dielectric stack 34. This process provides one example of a method where first sacrificial dielectric layer 16 is formed prior to formation of trench isolation region 22, while third sacrificial dielectric layer 32 is formed after formation of trench isolation region 22.

In the illustrated embodiment, third sacrificial dielectric layer 32 can be formed, for example, by depositing a dielectric material outwardly from the first sacrificial dielectric layer 16. Depositing third sacrificial dielectric layer 32 to form screen dielectric stack 34 provides an advantage of increasing the thickness of screen dielectric stack 34 without significantly affecting the size of the active area in the semiconductor device 10.

In one embodiment, third sacrificial dielectric layer 32 may comprise a dielectric material that is substantially similar to the dielectric material of first sacrificial dielectric layer 16. For example, the dielectric material forming first sacrificial dielectric layer 16 and third sacrificial dielectric layer 32 may comprise oxide or oxi-nitride.

In another embodiment, third sacrificial dielectric layer 32 may comprise a dielectric material that is different from the dielectric material of first sacrificial dielectric layer 16. If desirable, the dielectric materials for first sacrificial dielectric layer 16 and third sacrificial dielectric layer 32 may comprise dielectric materials that are selectively etchable from one another. For example, the dielectric material forming first sacrificial dielectric layer 16 may comprise oxide and the dielectric material forming third sacrificial dielectric layer 32 may comprise nitride.

After forming screen dielectric stack 34, active areas of semiconductor device 10 can be formed. Active areas of semiconductor device 10 may be formed, for example, by doping those areas to adjust the threshold voltage $V_t$ of semiconductor device 10. This doping may comprise, for example, a low energy ion implantation through screen dielectric stack 34. After implanting ions, screen dielectric stack 34 may be removed. By forming screen dielectric stack 34 to have a minimum screen dielectric thickness, active regions can be formed without causing implant channeling in semiconductor substrate 14.

As the scaling of semiconductor devices 10 continues to reduce their size, the thickness of the screen dielectric layer, used to protect the semiconductor substrate 14 during formation of active areas, likewise tends to decrease. For semiconductor devices 10 formed using shallow trench isolation, there exists a design relationship between the thickness of the screen dielectric layer and the formation of corner radius 24 within trench isolation region 22. Increasing the thickness of the screen dielectric layer generally causes an increase in corner radius 24 within trench isolation region 22. The increase in corner radius 24 results from the oxidation process that consumes a portion of semiconductor substrate 14 within trench isolation region 22.

While increasing corner radius 24 is desirable in reducing high electric field effects at corner 13, increasing corner radius 24 within trench isolation region 22 also tends to reduce the active area within semiconductor device 10. Thus, to create a balance between the benefits of corner radius 24 and the size of the active area in a scaled semiconductor device, conventional fabrication processes significantly reduce the thickness of the screen dielectric layer. Consequently, in conventional fabrication processes, as semiconductor geometry shrinks, the screen dielectric layer may fall short of providing adequate protection to the semiconductor substrate during formation of the active areas.

Forming a screen dielectric stack 34 comprising a plurality of independently formed layers provides an advantage of substantially preventing implant channeling into the semiconductor substrate 14 during the subsequent formation of active regions in the semiconductor device 10. At the same time, this technique facilitates adequate size of corner radius 24 while substantially preserving the size of the active regions in the semiconductor device. This provides an advantage of improving the reliability and gate oxide integrity of semiconductor device 10. In one particular embodiment of the invention, the combined thickness of screen dielectric stack 34 may comprise, for example, at least 100 Angstroms.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. A method of manufacturing a semiconductor device using shallow trench isolation, comprising:

forming a dielectric stack outwardly from a semiconductor substrate, the dielectric stack comprising:
   a first sacrificial dielectric layer disposed outwardly from the semiconductor substrate; and
   a second sacrificial dielectric layer disposed outwardly from the first sacrificial dielectric layer;
   wherein the first sacrificial dielectric layer is selectively etchable from the second sacrificial dielectric layer;

removing a portion of the first sacrificial dielectric layer, a portion of the second sacrificial dielectric layer, and a portion of the substrate to form a trench within the semiconductor substrate and the dielectric stack;

forming a first isolation dielectric region within the trench using thermal oxidation;

forming a second isolation dielectric region on said first isolation dielectric region within the trench;

removing the second sacrificial dielectric layer; and after removing the second sacrificial dielectric layer, depositing a dielectric material to form a third sacrificial dielectric layer outwardly from the first sacrificial dielectric layer, wherein a combined thickness of the first sacrificial dielectric layer and the third sacrificial dielectric layer comprises at least 100 Angstroms.

2. The method in claim 1, wherein the first sacrificial dielectric layer comprises a dielectric material selected from the group consisting of oxide and oxi-nitride, and the second sacrificial dielectric layer comprises nitride.

3. The method in claim 1, wherein the deposited dielectric material forming the third sacrificial dielectric layer comprises a dielectric material selected from the group consisting of oxide, oxi-nitride, and nitride.

* * * * *